United States Patent
You et al.

(10) Patent No.: US 12,238,910 B2
(45) Date of Patent: *Feb. 25, 2025

(54) DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Kuihua You, Hubei (CN); Jialiang Tang, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/534,540

(22) Filed: Dec. 8, 2023

(65) Prior Publication Data
US 2024/0107727 A1 Mar. 28, 2024

Related U.S. Application Data

(63) Continuation of application No. 17/598,838, filed as application No. PCT/CN2021/099140 on Jun. 9, 2021, now Pat. No. 11,895,813.

(30) Foreign Application Priority Data

May 26, 2021 (CN) .......................... 202110578908.0

(51) Int. Cl.
*H05K 9/00* (2006.01)
*H05K 5/03* (2006.01)

(52) U.S. Cl.
CPC ............. *H05K 9/0067* (2013.01); *H05K 5/03* (2013.01)

(58) Field of Classification Search
CPC ......... H05K 9/0067; H05K 5/03; G09F 9/301
See application file for complete search history.

(56) References Cited

U.S. PATENT DOCUMENTS

2019/0259968 A1* 8/2019 Choi ..................... H10K 59/131
2019/0272407 A1* 9/2019 Park ..................... G06V 40/1329
(Continued)

FOREIGN PATENT DOCUMENTS

CN   103258476 A   8/2013
CN   103682037 A   3/2014
(Continued)

OTHER PUBLICATIONS

Chinese Office Action issued in corresponding Chinese Patent Application No. 202110578908.0 dated Mar. 11, 2022, pp. 1-8.
(Continued)

*Primary Examiner* — Sherman Ng
(74) *Attorney, Agent, or Firm* — PV IP PC; Wei Te Chung

(57) ABSTRACT

The present application provides a display device comprising: a display panel including a display region and a non-display region, wherein the non-display region includes first and second fan-out regions and a bending region; an optical functional film layer formed in the display region and the first fan-out region; an adhesive layer formed on the optical functional film layer; and a protective layer located in the bending region and with a gap with the optical functional film layer, and an end of the adhesive layer extends beyond the optical functional film layer and is connected to the
(Continued)

protective layer, and the adhesive layer covers the optical functional film layer, the gap, and part of the protective layer.

18 Claims, 2 Drawing Sheets

(56) References Cited

U.S. PATENT DOCUMENTS

| | | | | |
|---|---|---|---|---|
| 2019/0341443 | A1* | 11/2019 | Son | H10K 71/00 |
| 2020/0050055 | A1 | 2/2020 | Higano et al. | |
| 2020/0245501 | A1* | 7/2020 | Wu | F28F 3/02 |
| 2021/0091321 | A1* | 3/2021 | Jeon | H01L 25/18 |

FOREIGN PATENT DOCUMENTS

| | | |
|---|---|---|
| CN | 104090677 A | 10/2014 |
| CN | 105786244 A | 7/2016 |
| CN | 108281387 A | 7/2018 |
| CN | 108682307 A | 10/2018 |
| CN | 109270619 A | 1/2019 |
| CN | 109560110 A | 4/2019 |
| CN | 110277435 A | 9/2019 |
| CN | 110515499 A | 11/2019 |
| CN | 110579916 A | 12/2019 |
| CN | 111864115 A | 10/2020 |
| CN | 112750883 A | 5/2021 |
| CN | 113284420 A | 8/2021 |
| TW | 200606744 A | 2/2006 |

OTHER PUBLICATIONS

International Search Report in International application No. PCT/CN2021/099140, mailed on Feb. 24, 2022.

Written Opinion of the International Search Authority in International application No. PCT/CN2021/099140, mailed on Feb. 24, 2022.

* cited by examiner

DISPLAY DEVICE

CROSS REFERENCE TO RELATED APPLICATIONS

The present application is a continuation application of U.S. patent application Ser. No. 17/598,838, entitled "DISPLAY DEVICE", filed on Sep. 27, 2021, which is a National Phase of PCT Patent Application No. PCT/CN2021/099140 having an international filing date of Jun. 9, 2021, which claims the benefit of priority of Chinese Patent Application No. 202110578908.0 filed on May 26, 2021. The contents of the above applications are all incorporated by reference as if fully set forth herein in their entirety.

BACKGROUND OF DISCLOSURE

Field of Disclosure

The present disclosure relates to the field of display technology, in particular to a display device.

Description of Prior Art

With development and maturity of flexible organic light-emitting diode (OLED) display technology, borderless OLED displays have become one of current important development trends. In a manufacturing process of the borderless OLED displays, pad bending technology has become one of keys to determine yield.

Currently, since the pad banding technology can significantly reduce a width of a frame of a display panel, the pad bending technology has been gradually replacing chip on film (COF) bending technology and has become a mainstream bending technology. The pad bending technology requires special-shaped cutting of a display substrate, removing a test region of the display substrate, and bending a pad region to a back of the display substrate to achieve a purpose of reducing the width of the frame.

In order to protect lines in a bending region of the display panel, a UV adhesive needs to be coated on the lines in the bending region of the display panel. In the prior art, the UV adhesive often needs to be connected with an optical functional film layer such as a polarizer to protect the display panel from electrostatic discharge (ESD). During a bending process, dislocation interference occurs between the UV adhesive and the optical functional film layer, resulting in excessive local stress on lines at junction of the UV adhesive and the optical functional film layer.

SUMMARY OF DISCLOSURE

A display device provided by the present disclosure can not only play a better ESD protection effect, but also can prevent dislocation interference between a protective layer and an optical functional film layer, which reduces local stress on lines at junction of the protective layer and the optical functional film layer.

To solve the above technical problems, the present disclosure provides technical solutions as follows:

The present disclosure provides a display device, wherein the display device comprises:
  a display panel comprising a display region and a non-display region, wherein the non-display region comprises a first fan-out region, a second fan-out region, and a bending region located between the first fan-out region and the second fan-out region;
  an optical functional film layer formed in the display region and the first fan-out region of the display panel;
  an adhesive layer formed on the optical functional film layer; and
  a protective layer formed on the display panel, wherein the protective layer is located in the bending region and spans a part of the first fan-out region and a part of the second fan-out region, and there is a gap with the optical functional film layer and the protective layer;
  wherein an end of the adhesive layer adjacent to the bending region extends beyond the optical functional film layer and is connected to the protective layer, and the adhesive layer covers the optical functional film layer, the gap, and a part of the protective layer.

In an alternative embodiment of the present disclosure, a width of a part of the adhesive layer that exceeds the optical functional film layer is defined as W, and $0<W\leq1.0$ mm.

In an alternative embodiment of the present disclosure, the adhesive layer is an optical clear adhesive, and the protective layer is a UV adhesive.

In an alternative embodiment of the present disclosure, the adhesive layer is located in the first fan-out region and the display region.

In an alternative embodiment of the present disclosure, the display device further comprises a cover plate formed on the adhesive layer, and an end of the cover plate adjacent to the bending region covers a part of the protective layer.

In an alternative embodiment of the present disclosure, the display device further comprises a flexible circuit board formed on the display panel and located in the second fan-out region.

In an alternative embodiment of the present disclosure, the display device further comprises:
  a first back supporting film layer attached to the display panel, wherein the first back supporting film layer is located in the first fan-out region and extends from the first fan-out region to the bending region;
  a substrate formed on the first back supporting film layer, wherein the first back supporting film layer is located between the first fan-out region of the display panel and the substrate; and
  a second back supporting film layer attached to the display panel, wherein the second back supporting film layer is located in the second fan-out region and extends from the second fan-out region to the bending region.

In an alternative embodiment of the present disclosure, the second back supporting film layer is disconnected from the first back supporting film layer.

In an alternative embodiment of the present disclosure, when the display panel located in the bending region is in a bending state, the second fan-out region partially overlaps the first fan-out region, and the second back supporting film layer is attached to a surface of the substrate away from the first back supporting film layer.

In an alternative embodiment of the present disclosure, the display panel further comprises a fixing layer formed between the second back supporting film layer and the substrate.

Beneficial effect of the present disclosure is that: the adhesive layer formed on the optical functional film layer in the display device provided by the present disclosure has an end adjacent to the bending region beyond the optical functional film layer and is connected with the protective layer formed on lines in the bending region, so that the optical functional film layer is not in contact with the protective layer, which can not only play a role in ESD protection, but also prevent dislocation interference between the protective layer and the optical functional film layer, which reduces local stress of lines at junction of the protective layer and the optical functional film layer.

DESCRIPTION OF DRAWINGS

In order to more clearly explain the technical solutions in the embodiments of the present disclosure, the following will briefly introduce the drawings required in the description of the embodiments. Obviously, the drawings in the following description are only some embodiments of the present disclosure. For those skilled in the art, without paying any creative work, other drawings can be obtained based on these drawings.

DETAILED DESCRIPTION OF EMBODIMENTS

Figure 1:
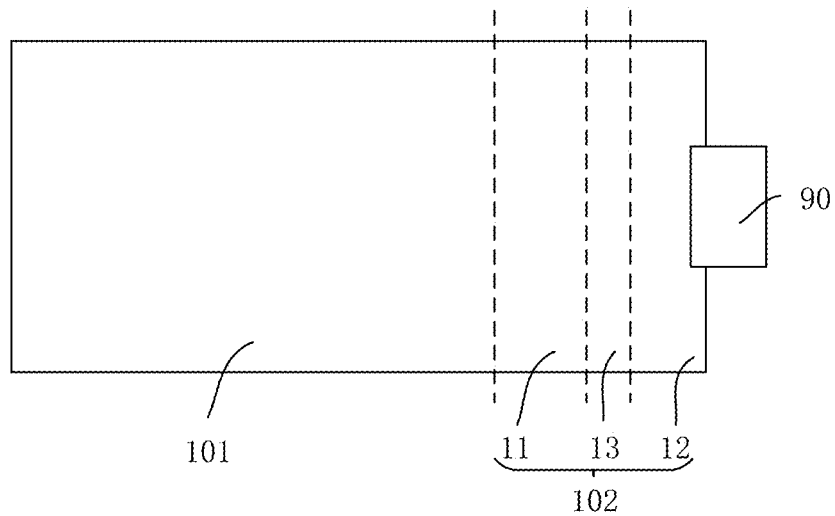
FIG. 1 is a schematic diagram of modules of a display device provided by the present disclosure.

Technical solutions in the embodiments of the present disclosure will be clearly and completely described below in conjunction with drawings in the embodiments of the present disclosure. Obviously, the described embodiments are only a part of embodiments of the present disclosure, rather than all the embodiments. Based on the embodiments in the present disclosure, all other embodiments obtained by those skilled in the art without creative work fall within the protection scope of the present disclosure.

In the description of the present disclosure, it should be understood that orientations or position relationships indicated by terms "upper", "lower", are based on orientations or position relationships illustrated in the drawings. The terms are used to facilitate and simplify the description of the present disclosure, rather than indicate or imply that devices or elements referred to herein are required to have specific orientations or be constructed or operate in the specific orientations. Accordingly, the terms should not be construed as limiting the present disclosure. In addition, terms "first", "second" are for illustrative purposes only and are not to be construed as indicating or imposing a relative importance or implicitly indicating the number of technical features indicated. Thus, a feature that limited by "first", "second" may expressly or implicitly include at least one of the features. In the description of the present disclosure, the meaning of "plural" is two or more, unless otherwise specifically defined.

Reference numerals and/or reference letters may be repeated in different examples in the present disclosure. This repetition is for purposes of simplicity and clarity and does not indicate a relationship of various embodiments and/or settings discussed.

In view of a technical problem of poor ESD protection capability of current display devices, in the present disclosure, an end of an adhesive layer formed on an optical functional film layer of a display device adjacent to a bending region extends beyond the optical functional film layer and is connected with a protective layer formed on lines of the bending region, so that the optical functional film layer does not contact with the protective layer, which can not only play a role of ESD protection, but also can prevent dislocation interference occurs between the protective layer and the optical functional film layer, thereby reducing local stress of lines at junction of the protective layer and the optical functional film layer.

The display device of the present disclosure will be described in detail below in conjunction with specific embodiments.

Figure 2:
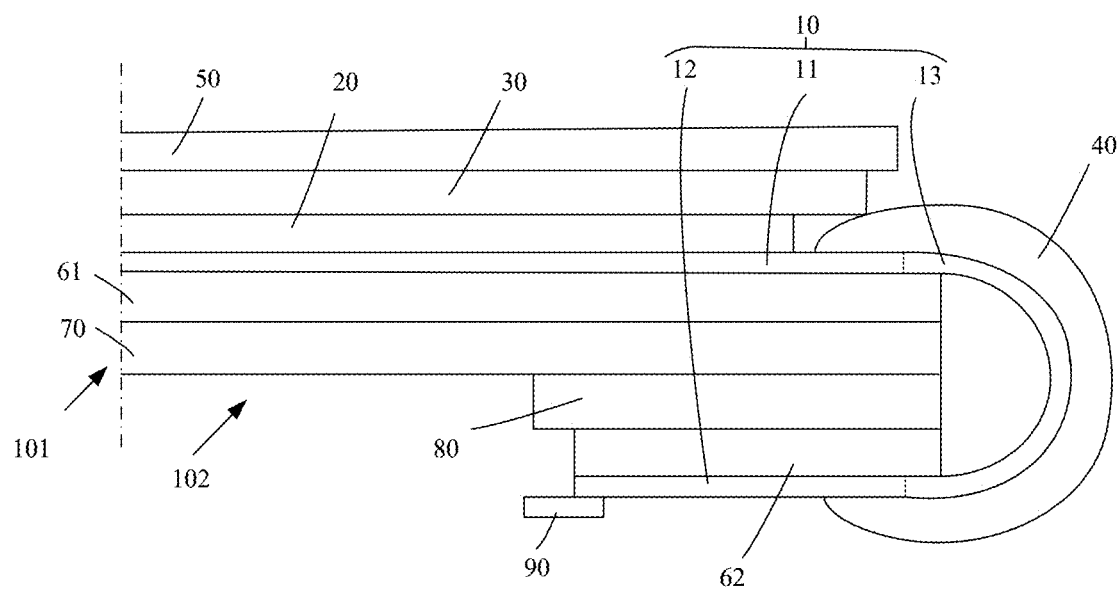
FIG. 2 is a schematic diagram of film layers of the display device shown in FIG. 1 (in a bending state).
Figure 3:
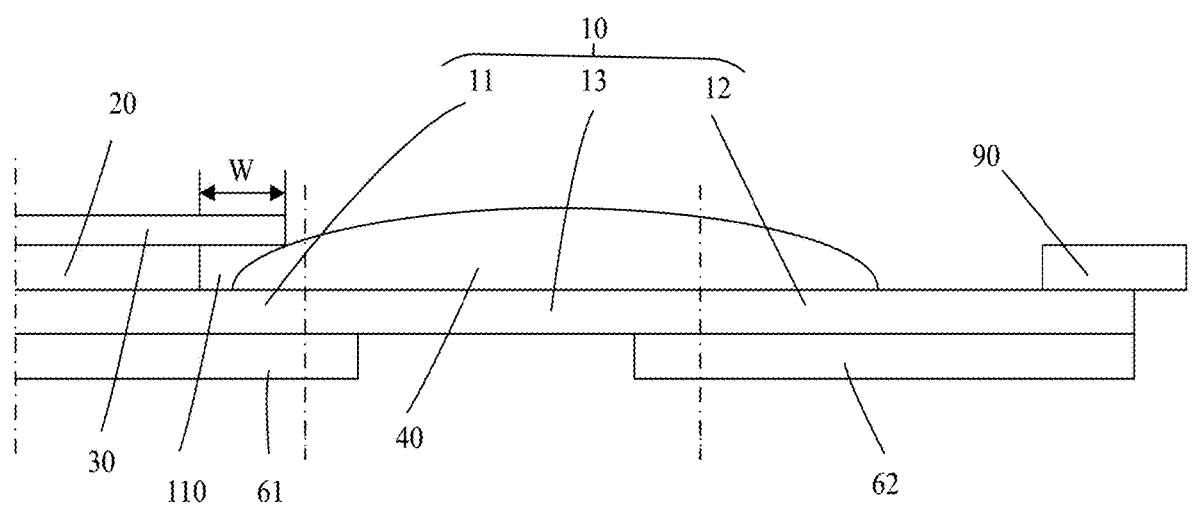
FIG. 3 is a schematic diagram of partial film layers of the display device shown in FIG. 1 (in a non-bending state).

Please refer to FIGS. 1-3. A preferred embodiment of the present disclosure provides a display device 100. The display device 100 may be a display screen, a computer, a mobile phone, and the like.

Wherein, the display device 100 comprises a display panel 10, an optical functional film layer 20, an adhesive layer 30, and a protective layer 40. Wherein, the optical functional film layer 20 and the protective layer 40 are both attached to the display panel 10, and the adhesive layer 30 is formed on the optical functional film layer 20.

Wherein, the display panel 10 comprises a display region 101 and a non-display region 102 adjacent to the display region 101. The display panel 10 located in the non-display region 102 comprises a first fan-out region 11, a second fan-out region 12, and a bending region 13 located between the first fan-out region 11 and the second fan-out region 12. Lines (not shown in the figures) are arranged in the bending region 13. After the bending region 13 is bent, the second fan-out region 12 partially overlaps the first fan-out region 11.

Specifically, the optical functional film layer 20 is located in the first fan-out region 11 and the display region. In an alternative embodiment of the present disclosure, the optical functional film layer 20 is a polarizing layer. In other embodiments, a type of the optical functional film layer 20 is not limited to the polarizing layer, and can be set and selected according to actual needs.

Specifically, an end of the adhesive layer 30 adjacent to the bending region 13 extends beyond the optical functional film layer 20. A width of a part of the adhesive layer 30 that exceeds the optical functional film layer 20 is defined as W, and 0<W≤1.0 mm. Preferably, 0<W≤0.5 mm, which ensures that the adhesive layer 30 and the protective layer 40 are connected together.

Wherein, the adhesive layer 30 is light-transmissive. In an alternative embodiment of the present disclosure, a light transmittance of the adhesive layer 30 is greater than 90%.

In an alternative embodiment of the present disclosure, a material of the adhesive layer 30 is optical clear adhesive (OCA). Wherein, the OCA is a special adhesive used to bond transparent optical components. The OCA has advantages such as colorless and transparent, a light transmittance above 90%, good bonding strength, curing at room temperature or medium temperature, and small curing shrinkage. When the OCA is used as an adhesive to spread over the optical functional film layer 20, the OCA has a good light transmittance and has little influence on display effect of the display panel.

In other embodiments, the material of the adhesive layer 30 is not limited to the optical clear adhesive, and may be other types of optical adhesive.

In an alternative embodiment of the present disclosure, the adhesive layer 30 is located in the first fan-out region 11. In other embodiments, a part of the adhesive layer 30 may also be located in the bending region 13.

Wherein, the protective layer 40 is configured to protect the lines in the bending region 13. Specifically, the protective layer 40 is located in the bending region 13 and spans a part of the first fan-out region 11 and a part of the second fan-out region 12. The adhesive layer 30 is connected to the protective layer 40. Specifically, the adhesive layer 30 covers the optical functional film layer 20 and a part of the protective layer 40. Since the adhesive layer 30 has fluidity, the adhesive layer 30 closely adheres to the protective layer 40 covered by the adhesive layer 30, which not only plays a role of ESD protection, but also prevents the protective layer 40 from being separated from the lines in the bending region 13 due to bending.

In an alternative embodiment of the present disclosure, a material of the protective layer 40 is a UV adhesive. In other embodiments, the material of the protective layer 40 is not limited to the UV adhesive, and can also be other types of adhesive that meet requirements.

Specifically, there is a gap 110 between the optical functional film layer 20 and the protective layer 40, that is, the optical functional film layer 20 does not contact the protective layer 40, so as to prevent dislocation interference between the protective layer 40 and the optical functional film layers 20, thereby reducing local stress of lines at junction of the protective layer 40 and the optical functional film layer 20. Wherein, a width of the gap 110 can be set according to actual conditions. Preferably, the width of the gap 110 is greater than 0 mm and less than 0.5 mm.

Specifically, the adhesive layer 30 covers the optical functional film layer 20, the gap 110, and a part of the protective layer 40. Since the adhesive layer 30 has fluidity, the adhesive layer 30 can fill the gap 110.

In an alternative embodiment of the present disclosure, the display device 100 further comprises a cover plate 50. The cover plate 50 is formed on the adhesive layer 30, and an end of the cover plate 50 adjacent to the bending region 13 covers the adhesive layer 30 and a part of the protective layer 40 to prevent the adhesive layer 30 from being exposed and protect the bending region 13.

Wherein, the cover plate 50 is usually made of glass or other transparent materials, a middle of the cover plate 50 is a light-transmitting portion (not shown in the figures), and periphery of the cover plate 50 is a mounting portion (not shown in the figures). In an alternative embodiment of the present disclosure, a light-shielding material is further coated on the mounting portion.

In an alternative embodiment of the present disclosure, the display device 100 further comprises a first back supporting film layer 61, a second back supporting film layer 62, and a substrate 70.

Wherein, the first back supporting film layer 61 is attached to the display panel 10, and the first back supporting film layer 61 is located in the first fan-out region 11 and extends from the first fan-out region 11 to the bending region 13.

Wherein, the second back supporting film layer 62 is attached to the display panel 10, and the second back supporting film layer 62 is located in the second fan-out region 12 and extends from the second fan-out region 12 to the bending region 13. The second back supporting film layer 62 and the first back supporting film layer 61 are disconnected.

Wherein, the substrate 70 is formed on the first back supporting film layer 61. The first back supporting film layer 61 is located between the first fan-out region 11 of the display panel 10 and the substrate 70.

In an alternative embodiment of the present disclosure, when the display panel 10 located in the bending region 13 is in a bending state, the second fan-out region 12 partially overlaps the first fan-out region 11. The second back supporting film layer 62 is attached to a surface of the substrate 70 away from the first back supporting film layer 61.

In an alternative embodiment of the present disclosure, the display device 100 further includes a fixing layer 80. The fixing layer 80 is formed between the second back supporting film layer 62 and the substrate 70 to fixedly connect the second back supporting film layer 62 and the second fan-out region 12 to the substrate 70. The fixing layer 80 also has a buffering effect.

In an alternative embodiment of the present disclosure, the display device 100 further comprises a flexible circuit board 90 formed on the display panel 10 and located in the second fan-out region 12. Therefore, the flexible circuit board 90 and the second back supporting film 62 are respectively formed on two opposite surfaces of the display panel 10 in the second fan-out region 12. The flexible circuit board 90 is configured to connect external electronic elements.

Beneficial effect of the present disclosure is that: the adhesive layer formed on the optical functional film layer in the display device provided by the present disclosure has an end adjacent to the bending region beyond the optical functional film layer and is connected with the protective layer formed on the lines in the bending region, so that the optical functional film layer is not in contact with the protective layer, which can not only prevent the dislocation interference between the protective layer and the optical functional film layer, but also reduce the local stress of the lines at the junction of the protective layer and the optical functional film layer, and can also play a role in ESD protection.

In summary, although preferred embodiments have been described above in the present disclosure, the above-mentioned preferred embodiments are not intended to limit the present disclosure. Those of ordinary skill in the art can make various modifications and changes without departing from the spirit and scope of the present disclosure. Therefore, the protection scope of the present disclosure is subject to the scope defined by the claims.

What is claimed is:

1. A display device, comprising:
    a display panel comprising a display region and a non-display region, wherein the non-display region comprises a first fan-out region, a second fan-out region, and a bending region located between the first fan-out region and the second fan-out region;
    an optical functional film layer formed in the display region and the first fan-out region of the display panel;
    an adhesive layer comprising a first portion formed on the optical functional film layer; and
    a protective layer formed on the display panel, wherein the protective layer is located in the bending region and spans a part of the first fan-out region and a part of the second fan-out region, and a gap is between the optical functional film layer and the protective layer;
    wherein an end of the adhesive layer adjacent to the bending region further comprises a second portion, the second portion of the adhesive layer extends beyond the optical functional film layer and is connected to the protective layer, and the second portion of the adhesive layer covers the gap and a part of the protective layer.

2. The display device of claim 1, wherein the first portion of the adhesive layer and the second portion of the adhesive layer are formed integrally.

3. The display device of claim 1, wherein the second portion of the adhesive layer is directly connected to the protective layer.

4. The display device of claim 1, wherein the first fan-out region is located between the display region and the bending region, and the second fan-out region is located on a rear of the display region.

5. The display device of claim 1, wherein a width of a part of the adhesive layer that exceeds the optical functional film layer is defined as W, and 0<W≤1.0 mm.

6. The display device of claim 1, wherein the adhesive layer is an optical clear adhesive, and the protective layer is an ultraviolet (UV) adhesive.

7. The display device of claim 1, wherein the adhesive layer is located in the first fan-out region and the display region.

8. The display device of claim 2, wherein the adhesive layer is located in the first fan-out region and the display region.

9. The display device of claim 3, wherein the adhesive layer is located in the first fan-out region and the display region.

10. The display device of claim 1, wherein the display device further comprises a cover plate formed on the adhesive layer, and an end of the cover plate adjacent to the bending region covers a part of the protective layer.

11. The display device of claim 2, wherein the display device further comprises a cover plate formed on the adhesive layer, and an end of the cover plate adjacent to the bending region covers a part of the protective layer.

12. The display device of claim 10, wherein the end of the cover plate adjacent to the bending region extends beyond the end of the adhesive layer adjacent to the bending region.

13. The display device of claim 11, wherein the end of the cover plate adjacent to the bending region extends beyond the end of the adhesive layer adjacent to the bending region.

14. The display device of claim 1, wherein the display device further comprises a flexible circuit board formed on the display panel and located in the second fan-out region.

15. The display device of claim 1, wherein the display device further comprises:
- a first back supporting film layer attached to the display panel, wherein the first back supporting film layer is located in the first fan-out region and extends from the first fan-out region to the bending region;
- a substrate formed on the first back supporting film layer, wherein the first back supporting film layer is located between the first fan-out region of the display panel and the substrate; and
- a second back supporting film layer attached to the display panel, wherein the second back supporting film layer is located in the second fan-out region and extends from the second fan-out region to the bending region.

16. The display device of claim 15, wherein the second back supporting film layer is disconnected from the first back supporting film layer.

17. The display device of claim 15, wherein when the display panel located in the bending region is in a bending state, the second fan-out region partially overlaps the first fan-out region, and the second back supporting film layer is attached to a surface of the substrate away from the first back supporting film layer.

18. The display device of claim 16, wherein the display panel further comprises a fixing layer formed between the second back supporting film layer and the substrate.

* * * * *